US007334479B2

(12) United States Patent
Leybovich

(10) Patent No.: US 7,334,479 B2
(45) Date of Patent: Feb. 26, 2008

(54) SYSTEMS AND METHODS FOR NON-CONTACT MEASURING SPUTTERING TARGET THICKNESS ULTRASONICS

(75) Inventor: Alexander Leybovich, Grove City, OH (US)

(73) Assignee: Tosoh SMD, Inc., Grove City, OH (US)

( * ) Notice: Subject to any disclaimer, the term of this patent is extended or adjusted under 35 U.S.C. 154(b) by 129 days.

(21) Appl. No.: 10/553,504

(22) PCT Filed: Apr. 21, 2004

(86) PCT No.: PCT/US2004/012292

§ 371 (c)(1), (2), (4) Date: Oct. 18, 2005

(87) PCT Pub. No.: WO2004/097401

PCT Pub. Date: Nov. 11, 2004

(65) Prior Publication Data

US 2006/0266121 A1 Nov. 30, 2006

Related U.S. Application Data

(60) Provisional application No. 60/465,190, filed on Apr. 24, 2003.

(51) Int. Cl.
*G01N 29/00* (2006.01)

(52) U.S. Cl. ............................ 73/620; 73/602; 73/632

(58) Field of Classification Search .......... 73/597–598, 73/602, 655–657, 620–623, 587, 632–633
See application file for complete search history.

(56) References Cited

U.S. PATENT DOCUMENTS 3,741,334 A * 6/1973 Kaule .......................... 73/630
5,406,850 A 4/1995 Bouchard et al.
5,631,424 A 5/1997 Nieters et al.
6,439,054 B1 8/2002 Gore et al.
6,487,910 B1 12/2002 Leybovich
6,494,098 B1 12/2002 Leybovich
6,837,109 B2 * 1/2005 Okuno et al. ................. 73/597
2002/0184970 A1 12/2002 Wickerahsm, Jr. et al.

FOREIGN PATENT DOCUMENTS

JP 02277448 A 11/1990

* cited by examiner

*Primary Examiner*—Helen Kwok
(74) *Attorney, Agent, or Firm*—Wegman, Hessler & Vanderburg

(57) ABSTRACT

A method and apparatus for ultrasonically measuring the thickness of sputter targets of varying shapes. An immersion bubble (32) and transducer (36) provide pulses to a front surface (24) and a front surface/bonded surface (26) interface of a target. The pulses generate reflected echoes that are converted to electric signals. By measuring the difference in time that the electric signals occur the thickness of the target may be approximated to identify whether the thickness of the target is appropriate for use. The system includes a sputter track (15), specimen (20), chuck (28), nozzle (34), columns (60), opening (62), inlet (70), cable (58), gauge (59), turret (90), position (92), remote PC controller (110), electrical line (112), and rear part (84).

20 Claims, 3 Drawing Sheets

110
112
59
58
84
92
90
36
70
32
76
34
62
24
15
26
20
60
15
28

32
306
304
60
302
C
300

306
60
302
32
304
300

60
32
402
404
400

506
502
504
60
32
500

SYSTEMS AND METHODS FOR NON-CONTACT MEASURING SPUTTERING TARGET THICKNESS ULTRASONICS

CROSS-REFERENCE TO RELATED APPLICATIONS

This application claims the priority filing benefit of U.S. Provisional Patent Application Ser. No. 60/465,190 filed Apr. 24, 2003.

BACKGROUND OF THE INVENTION

1. Field of Invention

This invention relates to non-contact ultrasonic thickness measurement of sputtering targets bonded to a backing plate using immersion bubbler technique and data acquisition over-sampling.

2. Description of Related Art

In the fabrication of integrated circuits and other electronic, opto-electronic, microwave, and MEM devices, multiple deposition and etch processes are performed in sequence to fabricate the desired electronic structures or devices. The current trend in fabrication has been to improve the performance and reliability of devices with simultaneous reduction in manufacturing cost. The ultimate goal is to fabricate devices in a way that combines improved performance (speed and capacity), with improved cost efficiency of manufacturing process. Manufacturing cost can be kept under control in a number of ways, particularly by reducing the cost of consumables used in the process. One of such consumables is a sputtering target. The cost of the sputtering target can be reduced substantially by replacing the part of expensive target material which is not a part of the sputter erosion process, with less expensive commercially available "backing" material. The "backing" material, in addition to cost reduction, provides improved mechanical, thermal, and even electrical properties of the target. This becomes of particular importance for targets made of mechanically soft materials. These targets can be deformed by thermo-mechanical stresses applied to the target during sputter-related heat load cycling. In contrast, a backing plate made of "backing" material provides extra mechanical stiffness and improved thermal conductance.

Backing material can be attached to the target in a number of ways. However, only three techniques, namely, mechanical, diffusion, or solder bonding, are of practical interest for target-to-backing plate joining. All three techniques require high or elevated pressure and high or elevated temperature to complete the bonding process. The drawback of these techniques is the significant difficulty in maintaining the pre-designed shape of the bond interface, for example, the flatness for planar targets. In many cases, when different target and "backing" materials are used, mismatches in thermal expansion coefficients of the different materials causes the bond interface to deflect from an originally predefined shape. The mechanical flattening which usually follows the bonding process is thus not always capable of flattening the bond interface to a satisfactory level. Therefore, in many cases only a partial correction of deflection of bonded interface is achieved that results in target thickness variations all over the target after sputter surface machining. The thickness variations, in turn, require close monitoring and measuring. Failure to determine the target minimum thickness may result in catastrophic performance of the target when the target sputters through the bond interface into the backing plate, causing contamination in sputtered films.

Attempts to use designing means to change the shape of pre-bonded surfaces to compensate for bonding-related deflection has shown mixed results. On the other hand, modeling, for example, by using finite element analyses, does not provide a satisfactory prediction for bond interface deflection due to many uncontrolled variables, which are typically not accounted for during analysis.

Therefore, there remains a need to measure the actual thickness of the target between front surface and the bonded interface. The conventional technique for thickness measurements of bonded assemblies is the ultrasonic NDT. A number of portable and stationary thickness measurement instruments or gauges are available from many NDT equipment manufacturers. The typical ultrasonic thickness gauge comprises an ultrasonic piezoelectric transducer electrically connected to an electronic block comprising, in turn, a pulser, a receiver, and a signal processor, which are controlled by the gauge's internal microcontroller.

The transducer, when excited by a short electric pulse from the pulser, generates a burst of high frequency mechanical vibrations or sound waves. This sound burst or pulse propagates through the specimen if the specimen is ultrasonically coupled to the transducer. The sound pulse, when it reaches the bond interface, bounces back to the transducer in the form of an echo. The transducer converts the echo back into an electric signal. The electric signal is processed by the gauge, which calculates the thickness of the specimen. When the thickness is calculated it is displayed and transferred to the remote controller if the gauge is equipped with a serial, USB, or other type of port.

Typical ultrasonic thickness gauges operate in the "Pulse/Echo" mode, by timing precisely the reflection of the echo bounced back at normal incidence from the reflecting surface such as the bond interface. If the gauge is calibrated to the speed of sound in the test material then the thickness is determined by an internal calculation performed by the gauge processor using the following relationship [Ref. 1]:

$$\text{Thickness}=V(t-t_0)/2$$

where: V—the velocity of sound in the material, t—the measured transit time of sound pulse, $t_0$—the zero offset factor (to correct for transducer internal delay, cable delay, and other fixed delays).

A typical gauge can measure thickness in three modes. Mode 1 is used with contact transducers when the transducer is directly coupled to the surface of the specimen. In this mode, the transit time is measured between a main bang MB pulse and a first returning echo. This method is simplest and it is frequently used for manual thickness measurements when the specimen is relatively thick, and only a few thickness data points are required to collect. Modes 2 and 3 are used with delay line, or immersion, transducers for the specimens of any, but preferably small or moderate, thickness when improved measurement accuracy is required. In Mode 2, the transit time is measured between the front surface and the first backwall (or bond interface) echoes, while in Mode 3 the transit time is usually measured between two consecutive echoes following the front surface echo. It is important to know that Mode 2 is preferred for materials with a higher sound attenuation, such as copper, cobalt, tantalum, or WTi while Mode 3 (which is most accurate among all three modes) is preferred for low attenuated materials such as aluminum, titanium, or tungsten.

Implementation of Modes 1, 2, or 3, when the transducer (with or without delay line) is directly coupled to a target surface, is limited to scratch resistant materials, since only a droplet of water can be used for target coupling. As seen frequently in practice, a thin layer of water does not provide an adequate protection for target surface, particularly of soft materials such as aluminum or copper, from scratching. Another drawback of direct contact coupling is that manual operation depends on operator hands-on experience. A still further drawback of direct contact coupling is the occasional difficulty in finding a region of the target with a minimal thickness. However, the direct contact coupling has one important advantage, namely, compactness and mobility, that makes it a preferred technique for use in-situ when the part remains attached to the chuck of the machining tool. This simplifies testing and reduces the overall test time.

Non-contact immersion Modes 2 and 3 are designed to overcome limitations of contact methods providing non-scratching, accurate, and automated methods of testing. Immersion thickness testing can be done in two ways. It can be done by submerging the entire target assembly and the transducer into a tank with de-ionized (DI) water where a stationary column of coupling water between target and transducer is formed. The advantage of this technique is the ability of using conventional C-Scan technology and equipment. The disadvantage of this technique is the relatively high cost since several steps are required to complete the test. Steps include removing the target from machining tool and placing it into a C-Scan tank for testing, then replacing the target back to the machining tool to complete machining. After-test machining is also required, at least as a refinishing measure, to remove the hydro-oxidation caused by extended exposure of the target surface to the water. Aluminum and copper-made targets are among of most susceptible to hydro-oxidation.

The other way of using immersion testing is a bubbler technique. The bubbler technique may provide a definite advantage for target thickness measurement compared to all previously discussed methods. The sound beam, in this case, propagates through a column of flowing water, which impinges into the target surface. As a result, the water exposure and subsequently hydro-oxidation can be minimized drastically by reducing the size of the water contact area and exposure time. This can be achieved by decreasing the diameter of the water contact area and by bringing this area into a continuous moving contact all over the target surface. However, there is a limitation frequently imposed by conventional bubbler techniques. The limitation is a lack of spatial resolution. Conventional conveyor-based bubbler techniques, for example, used in metal rolling mills and etc., acquire thickness data at certain spaced intervals usually pre-defined by conveyor speed and data acquisition rate. For high conveyor speed applications a plurality of positions from where the thickness data are sampled, can be separated be lengthy intervals that pose a danger of missing the positions with a critical minimum thickness. This is absolutely not acceptable for sputtering target applications. The region of a target with a minimum thickness should always be detected since the minimum thickness is among the most critically controlled target geometrical parameters, which governs pass/fail criterion of the target. Conventional bubbler techniques have another drawback, which may interfere with test remote operation. This additional drawback is the possibility of interruption in the data acquisition process due to occasional discontinuity in the water flow, especially for small bubbler apertures when a chain of air bubbles is formed in the water supply stream.

Therefore, there is still a need in the art for precision, low cost, non-contact, automated, ultrasonic target thickness measurement technique performed in-situ inside a machining tool.

SUMMARY OF THE INVENTION

This need and others are addressed by the bubbler-based, automated, non-contact ultrasonic thickness measurement method comprising the steps of sequentially irradiating rotating sputtering targets with sonic energy at normal incidence at a plurality of positions on the surface of the target; detecting echoes induced by the sonic energy and reflected from both surfaces of the target with a data acquisition frequency not synchronized with rotational speed of the target; measuring sound transit time between two consecutive echoes and calculating thickness by multiplying known sound velocity of target material by one half of measured transit time of sound pulse, corrected for zero offset factor; sending every value of the thickness data as soon as it is calculated to a remote controller; merging all values of thickness data points to form one sequential file of a statistically representative group of thickness values; analyzing this file of statistically representative group of thickness values to extract the value of target minimum thickness.

Unlike the prior art, the method of the present invention provides a target thickness measurement technique, which is always able to find and measure target minimum thickness. This is achieved by over-sampling of the target thickness data by multiple and repeated sampling from the same region of the target confined by a plurality of positions along the same circumferential path of constant radius formed by a number of consecutive revolutions. The over-sampling is achieved by irradiating the same region of the rotating target during more than one revolution using a stationary bubbler and a data acquisition frequency, which is not synchronized with the target RPM. In this case for every consecutive revolution a plurality of positions from where the data are collected does not repeat itself. Merging of all the thickness data points from each of the plurality of positions into one sequential file provides a statistically representative number of almost all-possible positions for a specific circumferential path. This improves the probability of finding and measuring the target minimum thickness.

It is another object of the invention to provide the apparatus for automated non-contact in-situ target thickness measurements. The apparatus consists of an enclosed immersion bubbler with outside shape and dimensions matching the shape and dimensions of the cutting tool holder of the machining tool; a bubbler body with a water extracting nozzle; a transducer, mounted inside the bubbler axially symmetrical with a nozzle at a distance from its opening; an electric cable connecting the transducer with a thickness gauge which, in turn, is remotely connected to a controller; a water supply line connecting the bubbler with a DI water source using at least two valves, connected in series, one for on/off operation and the second for precision water flow tuning.

The method, as described, can be used to measure the thickness of any planar, hollow cathode or other type of sputtering targets when the sound energy is confined into a beam directed nearly perpendicular to the tangent to both surfaces at the beam entrance positions. This method can also be used for non-target applications such as aircraft engines, or for targets of varying shapes (FIGS. 3-5).

These and other features and advantages of this invention are described in, or are apparent from, the following detailed description of various exemplary embodiments of the systems and methods according to this invention.

BRIEF DESCRIPTION OF THE DRAWINGS

Various exemplary embodiments of the systems and methods of this invention will be described in detail with reference to the following figures, wherein.

DETAILED DESCRIPTION OF EXEMPLARY EMBODIMENTS

Figure 1:
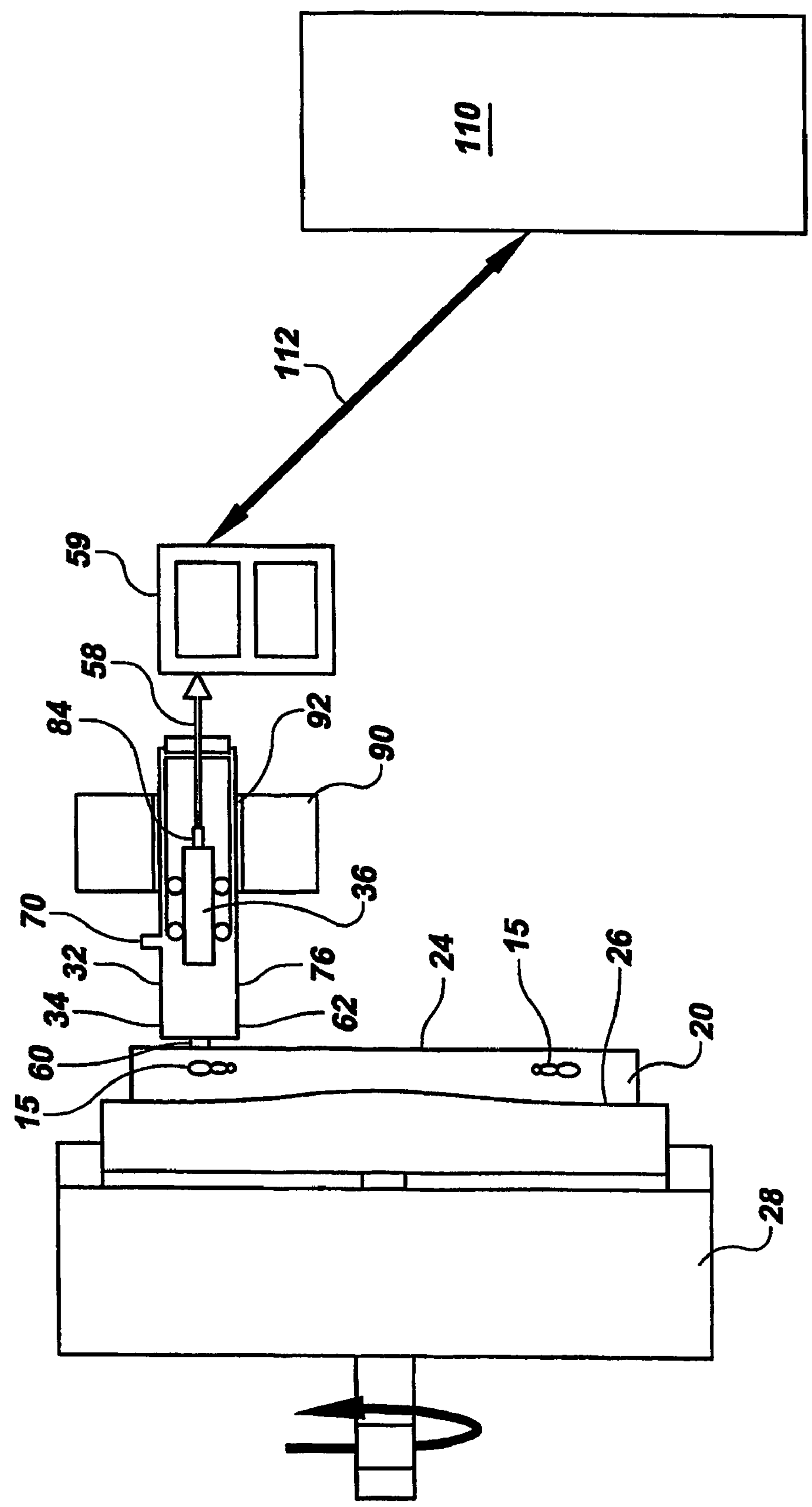
FIG. 1 illustrates a schematic diagram of an exemplary method and apparatus according to the invention.
Figure 2:
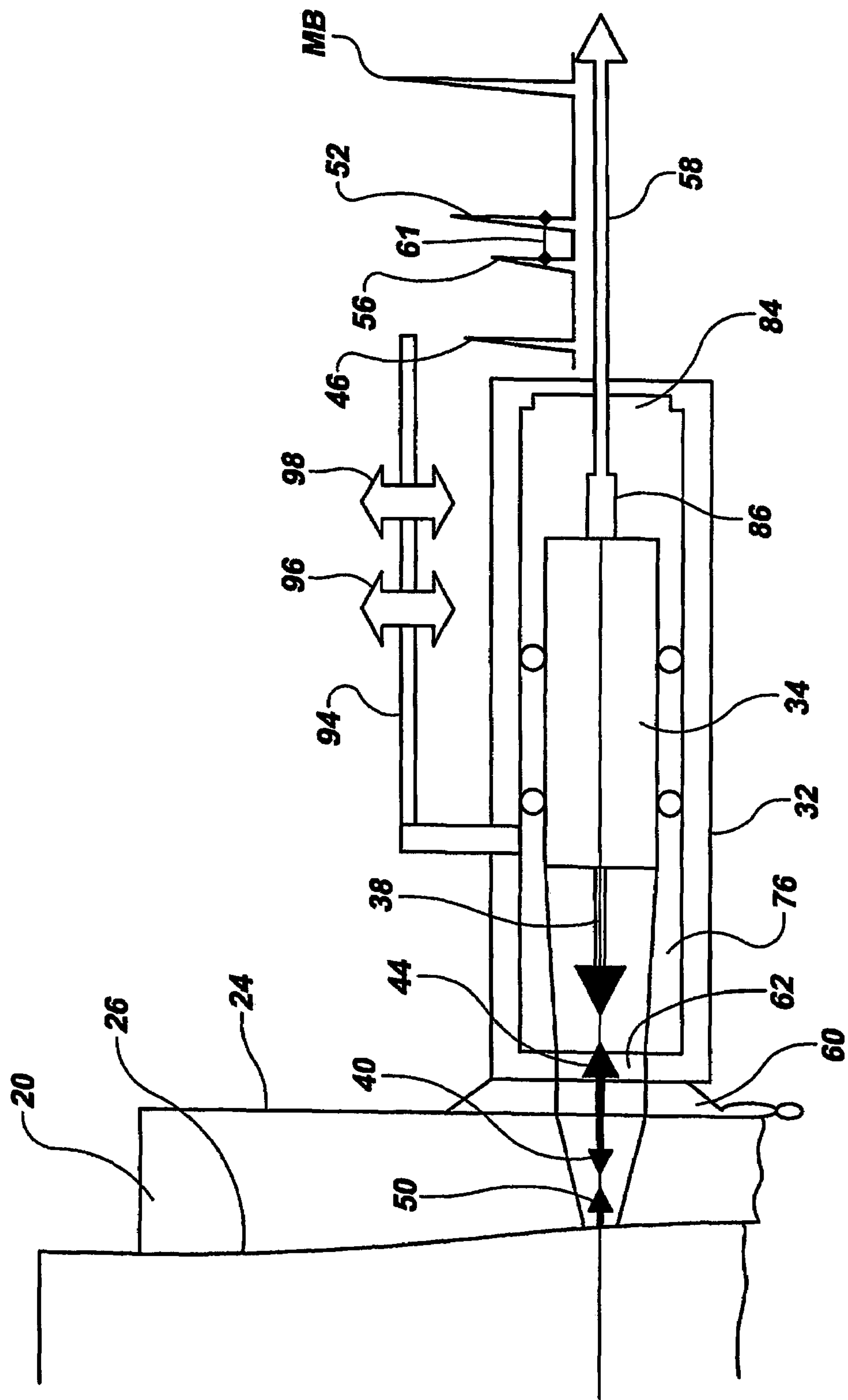
FIG. 2 illustrates a detailed schematic diagram of the method and apparatus of the invention.

Turning to FIGS. 1 and 2, there may be seen schematic diagrams illustrating the method of instant invention. In accordance with this method, a test target specimen 20 of a bonded target assembly having a planar front surface 24 and non-flat but smooth bonded surface 26 is mounted into chuck 28 of a machining tool. The machining tool rotates the specimen 20 axially symmetrically. Ultrasonic transducer 36 with a flat surface is mounted inside a bubbler 32. The transducer 36 is positioned axially symmetrical with a nozzle 34 at some distance from nozzle opening. The bubbler 32 is placed near the front surface 24 of specimen 20 preferably adjacent the sputter track 15 which is well known in the art as a particular section or region of the target that is most heavily consumed during the sputtering process. The transducer 36 irradiates the front surface 24 of the test specimen 20 with a single, short-duration, megahertz frequency range ultrasonic pulse 38 propagating through columns 76 and 60 of de-ionized (DI) water which connect the face of transducer 36 with the front surface 24 (FIGS. 1, 2). Part of ultrasonic pulse 38 in the form of an echo 44, is reflected back to the transducer 36 from the front surface 24. The other part 40 of the pulse 38 propagates through the body of the specimen 20 at nearly normal incidence to the tangent of smooth bonded surface 26, and is reflected back to the transducer in the form of echo 50. The transducer 36 thus receives echoes 44 and 50, converts them into electric signals 52 and 56, and sends them along the cable 58 to the gauge 59 for processing. By measuring the difference in time 61 it takes signal 52 from the first echo 44 to occur versus the signal 56 from the second echo 50 to occur, one can approximate the thickness of the specimen 20. Though the target specimen 20 of FIG. 1 is comprised of a generally planar front surface 24, the thickness of specimens having other shapes, such as U-shaped hollow cathode sputter targets having convex or concave front surfaces bonded to a backing surface, could also be measured using the systems and methods described herein by reflecting echoes from the front surface and front surface/bonded surface interface to the transducer as described above.

As illustrated in FIGS. 1 and 2, column 60 of flowing DI water is used to provide a path for ultrasonic pulse 38, and resulting echoes 44 and 50. The nozzle 34 with the opening 62 creates the column 60 of DI water with a diameter in the range of 0.187 in (4.75 mm). The opening 62 is placed most preferably at the distance of 0.020 in-0.040 in (0.5 mm-1.00 mm) from the surface 24 of the specimen 20. The DI water to the bubbler 32 is supplied through the inlet 70 with diameter of 0.157 in (4 mm). The inlet 70 is positioned behind the face of transducer 36. The length of water column 76 inside the bubbler between transducer 36 and the opening 62 is chosen most preferably in the range of 1.00-in. (25.4 mm). This length prevents detection of second echo 46 from the front surface 24 before arrival of echoes 44 and 50. The nozzle 34 has a removable lid (not shown) which is used to protect transducer 36 and bubbler 32 interior from contamination or damage by flying chips and cutting fluid, in the case when the bubbler is not in use. The rear part 84 of the bubbler 32 is permanently sealed to protect transducer electric connector 86.

The bubbler 32 is mounted on a turret 90 in the position 92 originally designated for the cutting tool. To provide the water to the bubbler 32 a plastic clear hose 94 is connected to inlet 70. The hose 94 is connected in series with two valves 96, 98. Valve 98 is used for on/off operation while the valve 96 is used for fine-tuning of water flow. The tuning of water flow is necessary to form a preferably continuous laminar flow which is free from isolated or chained air bubbles all along the water supply system including hose 94, and columns 76 and 60.

The presently preferred transducer 34 is sold by Krautkramer-AGFA Co under the designation 113-126-340. This is an IPS style immersion non-focused transducer with 0.250 in (6.35-mm) element size, and 10 MHz peak frequency. The transducer 36 is electrically connected to presently preferred thickness gauge 59, sold by Panametrics under the designation 25DL. The gauge 59, which has continuous thickness data output, is connected through RS-232 port with a remote PC controller 110 by electrical line 112. Controller 110 is programmed in a conventional manner to initiate the data acquisition event, to collect a series of consecutive thickness data points for several consecutive revolutions of the specimen 20, and finally to stop the data acquisition. Furthermore, controller 110 is programmed to process the data statistically to find a minimum thickness value. It is also programmed to display the minimum value and to send it to the database if required.

The method works as follows. At first, the bubbler 32 with removed lid is moved towards a measurement position. The repositioning can be done manually or automatically. If CNC is used then the bubbler 32 mounted on turret 90 is programmatically moved to a pre-programmed X-Y position. This X-Y position is chosen to match a target position with the radius of the deepest sputter erosion (sputter track area) 115. The X-Y positioning is followed by positioning along the Z axis that brings the bubbler nozzle opening 62 closer to the target surface 24 with a gap preferably in the range of 0.020-0.040 in (0.5 mm-1.00 mm). During the next step the target 20 is brought into rotation with a rotational speed preferably in the range of 1-100 RPM. Next, the water supply valve 98 is opened. The flow of the water is adjusted by the valve 96 to eliminate the turbulence and air bubble formation. During the next step, the PC controller 110 sends the command to the gauge 59 to start the data acquisition. The gauge acquisition rate (or frequency) is set preferably to the range of 1-50 acquisitions per second. It should be noted that the gauge should be preprogrammed and calibrated before the test using known material sound velocity and thickness ranges. The program can be stored internally in the gauge 59 memory or remotely in the controller 110 memory and should be recalled for the test. The target thickness is determined during every data acquisition event for every position on the target surface. The thickness value is sent automatically to remote controller 110 for storage and processing. When the pre-programmed number of thickness data points are collected preferably in the range of 100-10, 000 thickness data points collected, the controller 110 sends commands to the gauge 59 to stop the data acquisition. During the next step, controller 110 evaluates the collected data for the minimum thickness value or other value of interest. It should be emphasized that the data acquisition frequency should be chosen substantially different from the target RPM. In this case, a plurality of positions on the target surface from where the thickness data are collected would be substantially different for every consecutive revolution of the target. Merging of all these positions for all consecutive revolutions creates a file representing a surface ring formed by a plurality of repeatedly superimposed positions constituting a continuous area projected on a sputter track region.

Figure 3:
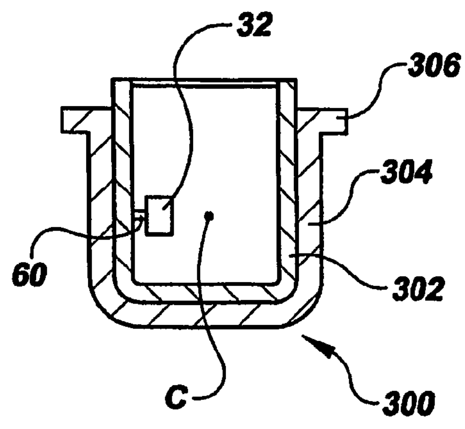
FIGS. 3, 3*a*, 4, and 5 illustrate other schematic diagrams of examples of apparatii able to be measured according to the systems and methods of the invention.
Figure 4:
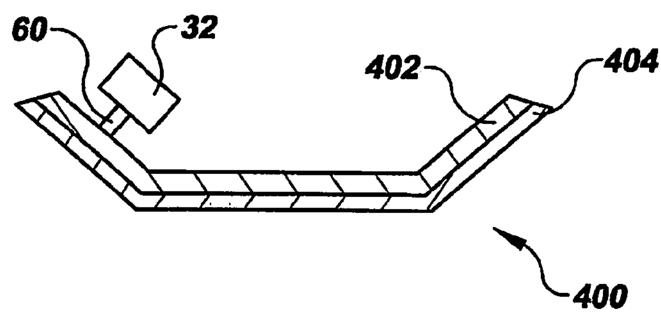
Figure 5:
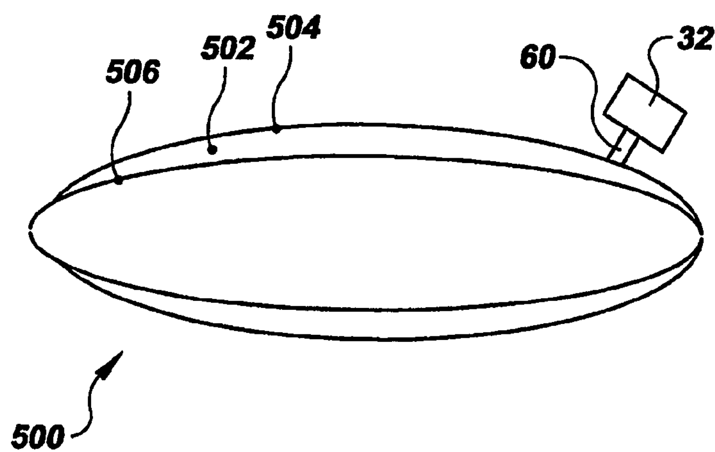

Of course, (while the exemplary embodiments of the invention described above comprise measuring the thickness of relatively flat specimens 20 bonded to smooth bonding surfaces 26, the measurement system and methods described could as well be used to determine the thickness of non-flat specimens such as U-shaped hollow cathode sputter targets, or other shaped specimens as shown in FIGS. 3-5, for example, as is evident to the artisan.

Turning now to FIG. 3, there is shown a hollow cathode target such as the type set forth in U.S. Pat. No. 6,419,806 (Holcomb et al.). The entire disclosure of this patent is incorporated by reference herein. Target assembly 300 comprises a substantially "U" cross sectioned combination of target 302 and surrounding backing plate 304. As known in the art, sputtering will occur from the inside surface of the target 302, shown here facing the center C of the "U" or pot like target. A flange 306 is located circumferentially around the perimeter of the backing plate to facilitate insertion into the cathode of the sputtering equipment.

Bubbler 32 and associated column 60 of water are shown schematically. Preferably, the bubbler location is stationary with the target assembly rotating therearound at varying rotation speed. Conversely, the bubbler itself could be moved relative to a stationary target via a robot or other programmable motion imparting mechanism.

Figure 3A:
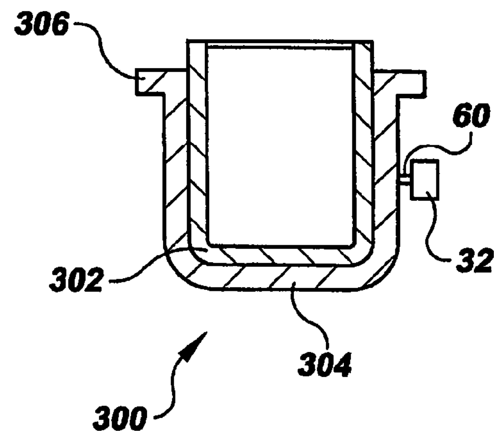

FIG. 3*a* shows an embodiment similar to 3 except the bubbler 32 is positioned along the outside of the assembly adjacent the backing plate component. Here, backing plate thickness can be measured and subtracted from overall assembly thickness to result in determination of target thickness. In this embodiment shown, the assembly 300 could be driven at varying rotational speed by a mandrel or the like.

FIG. 4 shows a concave target assembly 400 comprising target 402 bonded to backing plate 404. Bubbler 32 of the type shown in FIGS. 1 and 2 is moved along the concave target surface spaced from the target surface by a fixed dimension.

FIG. 5 shows bubbler 32 measuring the thickness of an elliptical shaped housing 500 such as could serve as an engine block or the like. Bubbler 32 is moved across outside surface 504 of the housing and measures thickness between the outside surface 504 and inside surface 506.

In all of the embodiments shown, either the target itself and/or the bubbler may be moved relative to the other. In most cases, the target is rotated relative to the bubbler such as preferred for the embodiments of 1-5. The speed of the target and the data acquisition frequency are asynchronous. In other words, at the end of the data acquisition process, measurement points along the target surface are not characterized by fixed intervals or distances therebetween. Accordingly, a multiplicity of measurements are taken at pseudo-random data collection locations along the target surface. The method of the invention allows thickness measurement with very brief intervals between adjacent measurement locations, which locations may not be taken during one single revolution. For example, thickness data for three adjacent measurement locations—one chosen, one to the left, and one to the right of the chosen one can be collected during three different revolutions.

As a practical matter, the rotational speed of the target is changed during the measurement time period since most commercially available bubblers presently have fixed data acquisition frequencies. The skilled artisan will appreciate however that frequency of data acquisition could also theoretically be varied relative to target rotational speed in order to provide for asynchronous relationship between target speed and data acquisition frequency as used herein.

While the method herein described, and the form of apparatus for carrying this method into effect, constitutes a preferred embodiment of this invention, it is to be understood that the invention is not limited to this precise method and form of apparatus, and that changes may be made in either without departing from the scope of the invention, which is defined in the appended claims. For example, a bubbler is shown as the preferred medium through which the sound beam is propagated to impinge upon the target. Other media may be chosen by those skilled in the art.

What is claimed is:

1. A method of non-contact ultrasonic thickness measurement of sputtering targets having a front surface and a front surface/bonded surface interface comprising the steps of:

a) securing a target to a holder and rotating said target;

b) sequentially irradiating the front surface with pulses of sonic energy at a plurality of positions at substantially normal incidence to a tangent line at a plurality of positions on the front surface, at least one of the pulses of sonic energy propagating through the front surface to the front surface/bonded surface interface;

c) detecting consecutive echoes induced by said pulses of sonic energy, the echoes being reflected from the front surface and from the front surface/bonded surface interface, respectively;

d) converting the front surface echoes and the front surface/bonded surface interface echoes into corresponding electric signals;

e) determining transit time of a sound path between the front surface echoes and the front surface/bonded surface interface echoes based on the corresponding electric signals;

f) determining thickness data of the target by multiplying known sound velocity of the target material by one half of the determined transit time, corrected for a zero offset factor;

g) electronically sending the determined thickness data to a remote controller;

h) collecting thickness data for a plurality of positions on the target;

i) analyzing the collected data and determining the minimum thickness of the target.

2. The method as recited in claim 1 wherein said target remains attached to a rotating machining tool chuck or other specimen holder and is rotated axially symmetrically during the entire thickness measurement process.

3. The method as recited in claim 1 wherein step (b) includes providing a bubbler assembly adjacent said front surface, said bubbler assembly including a sonic energy irradiation means for irradiating said front surface with sonic energy at a data acquisition frequency.

4. The method as recited in claim 1 wherein step (b) includes coupling the rotating target with an ultrasonic transducer by a column of a non-turbulent bubble-free stream of water to the front surface of the target.

5. The method as recited in claim 1 wherein step (b) includes irradiating the target with sonic energy passing through a water column generated by an immersion bubbler.

6. The method as recited in claim 1 wherein step (b) includes impinging the target with sonic energy in a form of short duration, MHz frequency ultrasound pulse.

7. The method as recited in claim 1 wherein the echoes are detected with a data acquisition frequency substantially non-synchronized with the RPM (revolution per minute) of the rotating target.

8. The method as recited in claim 1, wherein said echoes are detected from a plurality of positions for more than one revolution of target under rotation.

9. The method as recited in claim 1, wherein all the data points of thickness data are merged into one sequential file.

10. The method as recited in claim 1, wherein irradiating said target with pulsed sonic energy occurs additionally along a circumferential path of constant radius constituted by a plurality of all possible positions on the target front surface encompassing the ring with the area projected into the region of deepest sputter erosion.

11. The method as recited in claim 1, wherein the sputter target is a hollow cathode sputter target having one of a convex and a concave front surface, and wherein the sputter target is bonded to a backing plate to form a target assembly.

12. Apparatus for measuring thickness of a sputtering target bonded into an assembly comprising:

a transducer for sequentially irradiating a sputtering target with sonic energy and for detecting echoes induced by said sonic energy;

an enclosed immersion bubbler, encompassing the transducer, mounted axially, symmetrical with a nozzle of said bubbler at normal incidence to a front surface of the target;

a thickness gauge electrically connected to said transducer and programmed to measure a sound transit time between two consecutive echoes, and programmed to calculate the target thickness, based on known sound velocity, transit time, and zero offset factor;

a controller electrically connected to the thickness gauge and programmed:

a) to send a trigger command to start a data acquisition;

b) to receive and calculate values of the thickness as soon as thickness data collection is completed;

c) to merge each calculated thickness value into one sequential file;

d) to send a trigger command to stop the data acquisition;

e) to analyze the data, determine and display the value for the minimum target thickness.

13. The apparatus as recited in claim 12 wherein said bubbler is physically spaced from the target front surface so as to not contact physically the front surface of the target, and said bubbler includes a nozzle having an opening providing fully transparent transmission of sound energy to and from the transducer.

14. The apparatus as recited in claim 12 wherein said transducer is positioned inside the bubbler a distance from the nozzle opening to prevent receipt of an interfering echo prior to receipt of consecutive echoes from the front surface of the target and from a front surface/bonded surface interface of the target, respectively.

15. A method for making non-contact ultrasonic thickness measurement of a component of a sputter target assembly comprising the steps of:

a) positioning the assembly on a mounting member;

b) providing a source of sonic energy irradiation adjacent a surface of said component for irradiating said surface with sonic energy at a data acquisition frequency;

c) providing movement of said sputter target assembly relative to said source of sonic energy irradiation and asynchronously relating said movement relative to said data acquisition frequency;

d) sequentially irradiating the surface of said component with pulses of sonic energy from said source of sonic energy irradiation;

e) detecting consecutive echoes induced by said pulses of sonic energy; and f) determining thickness of said component by determining time intervals between said consecutive echoes.

16. A method as recited in claim 15 wherein said step (c) comprises rotating said target assembly around a fixed position bubbler assembly.

17. A method as recited in claim 16 wherein said step (c) comprises varying the rotational speed of said target assembly during said measurement.

18. A method as recited in claim 17 wherein said data acquisition frequency comprises fixed equal intervals.

19. A method as recited in claim 15 wherein said target assembly has a substantially "U" shaped cross section.

20. A method for making non-contact ultrasonic thickness measurement of a component of a sputter target assembly comprising the steps of:

a) positioning the assembly on a mounting member;

b) providing a source of sonic energy irradiation adjacent a surface of said component for irradiating said surface with sonic energy at a data acquisition frequency;

c) providing movement of said sputter target assembly relative to said source of sonic energy irradiation and asynchronously relating said movement relative to said data acquisition frequency;

d) sequentially irradiating the surface of said component with pulses of sonic energy from said source of sonic energy irradiation;

e) detecting consecutive echoes induced by said pulses of sonic energy; and f) determining thickness of said component by determining time intervals between said consecutive echoes, wherein said component comprises a target, said target assembly further comprising a backing plate bonded to said target, said target having a front surface and a back surface bonded to said backing plate, said step (d) comprising irradiating said front surface of said target and wherein said consecutive echoes include, sequentially, echoes from said front surface and echoes from said back surface.

* * * * *